(12) United States Patent
Furutani

(10) Patent No.: US 6,915,479 B2
(45) Date of Patent: Jul. 5, 2005

(54) APPARATUS AND METHOD FOR ERROR CORRECTION

(75) Inventor: Senichi Furutani, Daito (JP)

(73) Assignee: Matsushita Electric Industrial Co., Ltd. (JP)

(*) Notice: Subject to any disclaimer, the term of this patent is extended or adjusted under 35 U.S.C. 154(b) by 412 days.

(21) Appl. No.: 10/146,127

(22) Filed: May 16, 2002

(65) Prior Publication Data

US 2002/0174398 A1 Nov. 21, 2002

(30) Foreign Application Priority Data

May 17, 2001 (JP) ........................................ 2001-147340

(51) Int. Cl.[7] .............................................. H03M 13/00
(52) U.S. Cl. ...................... 714/784; 714/785; 714/755
(58) Field of Search ................................ 714/755, 784, 714/785, 775, 701, 786; 375/286, 259; 725/111; 348/554

(56) References Cited

U.S. PATENT DOCUMENTS

| | | | | |
|---|---|---|---|---|
| 5,835,165 A | * | 11/1998 | Keate et al. ............ | 375/240.27 |
| 5,912,898 A | | 6/1999 | Khoury | |
| 5,987,070 A | * | 11/1999 | Fimoff et al. ............... | 375/286 |
| 5,996,103 A | | 11/1999 | Jahanghir .................... | 714/755 |
| 6,009,544 A | | 12/1999 | Nara .......................... | 714/701 |
| 6,014,411 A | * | 1/2000 | Wang ......................... | 375/259 |
| 6,029,264 A | * | 2/2000 | Kobayashi et al. .......... | 714/755 |
| 6,067,646 A | | 5/2000 | Starr .......................... | 714/701 |
| 6,075,569 A | * | 6/2000 | Lee et al. ................... | 348/554 |
| 6,411,654 B1 | | 6/2002 | Furutani et al. ............ | 375/262 |

FOREIGN PATENT DOCUMENTS

| | | |
|---|---|---|
| EP | 0 408 754 A1 | 1/1991 |
| JP | 5-31973 | 5/1993 |
| JP | 7-254862 | 10/1995 |
| JP | 2000-13356 | 1/2000 |

OTHER PUBLICATIONS

American National Standard: "Digital Video Transmission Standard for Cable Television," Society of Cable Telecommunications Engineers, Jul. 2000, pp. 8–11.

* cited by examiner

Primary Examiner—Albert Decady
Assistant Examiner—Mujtaba Chaudry
(74) Attorney, Agent, or Firm—Parkhurst & Wendel, L.L.P.

(57) ABSTRACT

An error correction apparatus and an error correction method according to the present invention can reduce an entire lead-in time of a demodulation system by reducing a lead-in time for deinterleave mode judgement, which greatly affects the entire lead-in time of the demodulation system. This error correction apparatus employs an output signal (perror) from a Reed-Solomon decoding unit that is connected outside of a deinterleave unit, as a trigger for changing deinterleave modes (dimode).

18 Claims, 7 Drawing Sheets

Fig.5

| Deinterleave mode | Number of channels | Depth |
|---|---|---|
| 0 | 128 | 1 |
| 1 | 128 | 1 |
| 2 | 128 | 2 |
| 3 | 64 | 2 |
| 4 | 128 | 3 |
| 5 | 32 | 4 |
| 6 | 128 | 4 |
| 7 | 16 | 8 |
| 8 | 128 | 5 |
| 9 | 8 | 16 |
| 10 | 128 | 6 |
| 11 | - | - |
| 12 | 128 | 7 |
| 13 | - | - |
| 14 | 128 | 8 |
| 15 | - | - |

APPARATUS AND METHOD FOR ERROR CORRECTION

FIELD OF THE INVENTION

The present invention relates to an error correction apparatus and an error correction method, which are required in digital transmission like satellite broadcasting, terrestrial broadcasting, cable broadcasting, and the like. More particularly, this invention relates to an error correction apparatus and an error correction method, which perform error correction for received data in accordance with a deinterleave mode that is inserted in the received data.

BACKGROUND OF THE INVENTION

According to communication systems in which elements for deinterleaving data, e.g., the number of channels and the depth in the case of convolutional deinterleave, and the number of rows and the number of columns in the case of block deinterleave, are regularly inserted into the data, the deinterleave mode has been conventionally judged by a method in which a protection mode is adopted at the start of receiving or change of modes, or judged by a majority decision method.

FIG. 7 is a diagram illustrating a structure of an error correction apparatus according to a prior art.

An input terminal 102 receives a frame sync signal (fsync). An input terminal 103 receives a Reed-Solomon packet sync signal (psync1). An input terminal 104 receives data (data1).

A deinterleave unit 108 subjects the inputted data (data1) to deinterleaving corresponding to a deinterleave mode (dimode) decided by a deinterleave mode majority judgement unit 109. The deinterleave mode majority judgement unit 109 decides the deinterleave mode (dimode) on the basis of majority decision. A Reed-Solomon decoding unit 110 subjects deinterleaved data (data2) to Reed-Solomon decoding.

An output terminal 111 outputs a Reed-Solomon packet sync signal (psync3) which is synchronized with data (data3). An output terminal 112 outputs a Reed-Solomon packet error signal (perror) which is synchronized with the data (data3). An output terminal 113 outputs Reed-Solomon decoded data (data3).

The operation of the error correction apparatus that is configured as described above will be described.

The data (data1), the frame sync signal (fsync) that is synchronized with the data, and the Reed-Solomon packet sync signal (psync1) that is synchronized with the data are inputted through the respective input terminals 102 to 104 to the deinterleave mode majority judgement unit 109 and the deinterleave unit 108.

The deinterleave mode majority judgement unit 109 extracts a predetermined number of deinterleave modes which are inserted regularly, for example, for each frame, into the data (data1) inputted through the input terminal 104, then makes majority decision, to decide a deinterleave mode (dimode), and outputs the decided mode to the deinterleave unit 108.

Next, the deinterleave unit 108 subjects the data (data1) inputted through the input terminal 104 to deinterleaving corresponding to the decided deinterleave mode (dimode), and outputs deinterleaved data (data2) and a Reed-Solomon packet sync signal (psync2) that is synchronized with the deinterleaved data, to the Reed-Solomon decoding unit 110.

Then, the Reed-Solomon decoding unit 110 subjects the data (data2) to Reed-Solomon decoding, and outputs decoded data (data3) to the output terminal 113, as well as outputs a Reed-Solomon packet sync signal (psync3) that is synchronized with the data (data3) to the output terminal 111, and further outputs a Reed-Solomon packet error signal (perror) that is synchronized with the data (data3) to the output terminal 112.

As described above, in the prior art error correction apparatus, the deinterleave mode majority judgement unit 109 extracts a predetermined number of deinterleave modes which are inserted into inputted data (data1) regularly (for example, for each frame), and makes majority decision to decide a deinterleave mode, thereby realizing the deinterleaving.

According to the prior art error correction apparatus, a demodulation unit that is provided at the previous stage of the deinterleave unit requires time for clock reproduction from a carrier, or lead-in time for detecting frame synchronization/segment synchronization. Because the frequency of the carrier is high, the time to reproduce the clock is relatively short. In addition, the frame synchronization/segment synchronization is usually detected on the basis of the majority decision, and thus almost the same lead-in time as that for detecting a deinterleave mode is required. As described above, the lead-in time for the deinterleave judgement occupies a large proportion of the entire lead-in time for the demodulation system, and therefore it is thought that the entire lead-in time of the demodulation system is greatly affected.

However, since a transmission efficiency should be enhanced, in order to transmit a large quantity of data, the proportion occupied by deinterleave modes in all the data becomes small, and the demodulation system entirely requires a long lead-in time.

SUMMARY OF THE INVENTION

The present invention has for its object to provide an error correction apparatus and an error correction method, which can reduce the lead-in time for deinterleave mode judgement.

Other objects and advantages of the present invention will become apparent from the detailed description and specific embodiments described are provided only for illustration since various additions and modifications within the spirit and scope of the invention will be apparent to those of skill in the art from the detailed description.

According to a 1st aspect of the present invention, there is provided an error correction apparatus which performs error correction of received data according to a deinterleave mode inserted in the received data, comprising: a deinterleave unit for receiving a frame sync signal and a Reed-Solomon packet head signal which are synchronized with the received data, deinterleaving the received data, and outputting deinterleaved data and a Reed-Solomon packet head signal that is synchronized with the deinterleaved data; a Reed-Solomon decoding unit for receiving the Reed-Solomon packet head signal that is synchronized with the deinterleaved data, Reed-Solomon decoding the deinterleaved data, and outputting Reed-Solomon decoded data resulting from error correction as well as outputting a Reed-Solomon packet head signal and a Reed-Solomon packet error signal which are synchronized with the Reed-Solomon decoded data; and a deinterleave mode generation unit for receiving the Reed-Solomon packet head signal and the Reed-Solomon packet error signal as trigger signals for deinterleave changing, and generating the deinterleave mode. Therefore, the lead-in time for deinterleave mode judgement can be reduced, whereby the entire lead-in time of the demodulation system at the switching of deinterleave modes can be reduced.

According to a 2nd aspect of the present invention, in the error correction apparatus of the 1st aspect, the deinterleave mode generation unit includes: a calculation means for calculating a switching comparison value from the trigger signals; a comparison means for comparing the switching comparison value with a predetermined deinterleave mode switching criterion; and a changing means for, when the switching comparison value satisfies the deinterleave mode switching criterion, changing the deinterleave mode from a deinterleave mode initial value in accordance with a deinterleave mode switching order, and outputting a changed deinterleave mode. Therefore, the lead-in time for deinterleave mode judgement can be reduced, whereby the entire lead-in time of the demodulation system at the switching of deinterleave modes can be reduced.

According to a 3rd aspect of the present invention, in the error correction apparatus of the 1st or 2nd aspect, the deinterleave unit includes: an address generation unit for receiving the frame sync signal, generating memory addresses corresponding to respective deinterleave modes, selecting among the generated memory addresses a memory address corresponding to the deinterleave mode generated by the deinterleave mode generation unit, and outputting the selected memory address; and a memory for deinterleaving the received data in accordance with the selected memory address and outputting deinterleaved data. Therefore, the lead-in time for deinterleave mode judgement can be reduced, whereby the entire lead-in time of the demodulation system at the switching of deinterleave modes can be reduced.

According to a 4th aspect of the present invention, in the error correction apparatus of the 3rd aspect, the deinterleave unit performs convolutional deinterleave using information concerning the number of channels and a depth for each deinterleave mode. Therefore, the lead-in time at the convolutional deinterleave mode judgement can be reduced.

According to a 5th aspect of the present invention, in the error correction apparatus of the 4th aspect, the deinterleave unit includes: a number-of-channel counter for outputting respective numbers of channels for all deinterleave modes upon receipt of the frame sync signal; and a selector for receiving the deinterleave mode generated by the deinterleave mode generation unit, selecting one output of the number-of-channel counter in accordance with the generated deinterleave mode, and outputting the selected output to the address generation unit, and the address generation unit identifies a depth for the convolutional deinterleave on the basis of the deinterleave mode generated by the deinterleave mode generation unit and the number of channels, and generates the memory address. Therefore, the lead-in time for convolutional deinterleave mode judgement can be reduced, whereby the entire lead-in time of the demodulation system at the switching of deinterleave modes can be reduced.

According to a 6th aspect of the present invention, in the error correction apparatus of the 3rd aspect, the deinterleave unit performs block deinterleave using information concerning the number of rows and the number of columns for each deinterleave mode. Therefore, the lead-in time at the block deinterleave judgement can be reduced.

According to a 7th aspect of the present invention, in the error correction apparatus of the 6th aspect, the deinterleave unit generates respective numbers of rows for all deinterleave modes upon receipt of the frame sync signal, then selects, among the generated numbers of rows for all deinterleave modes, a number of rows corresponding to the deinterleave mode generated by the deinterleave mode generation unit, identifies a number of columns in the block deinterleave on the basis of the selected number of rows and the generated deinterleave modes, and generates the memory address. Therefore, the lead-in time for the block deinterleave mode judgement can be reduced, whereby the entire lead-in time of the demodulation system at the switching of deinterleave modes can be reduced.

According to an 8th aspect of the present invention, in the error correction apparatus of the 1st aspect, the deinterleave mode generation unit generates the deinterleave mode when a reset signal is inputted upon change of a frame head position. Therefore, the lead-in time for the deinterleave mode judgement can be reduced, whereby the entire lead-in time of the demodulation system at the reset can be reduced.

According to a 9th aspect of the present invention, in the error correction apparatus of the 1st aspect, a selector for selecting either the deinterleave mode outputted from the deinterleave mode generation apparatus, or a deinterleave mode inputted from outside, in accordance with a select signal that is inputted from outside, and outputting the selected deinterleave mode is provided between the deinterleave mode generation unit and the deinterleave unit. Therefore, the leading into the deinterleave mode is completed in the minimum lead-in time, whereby the lead-in time of the demodulation system at the switching of modes can be reduced.

According to a 10th aspect of the present invention, there is provided an error correction method for performing error correction of received data according to a deinterleave mode inserted in the received data, comprising: a deinterleave step of receiving the deinterleave mode, and a frame sync signal and a Reed-Solomon packet head signal which are synchronized with the received data; a Reed-Solomon decoding step of receiving deinterleaved data and a Reed-Solomon packet head signal that is synchronized with the deinterleaved data, and Reed-Solomon decoding the deinterleaved data; and a deinterleave mode changing step of changing the deinterleave mode using a Reed-Solomon packet head signal and a Reed-Solomon packet error signal which are synchronized with the Reed-Solomon decoded data as trigger signals. Therefore, the lead-in time for the deinterleave mode judgement can be reduced, whereby the entire lead-in time of the demodulation system at the switching of deinterleave modes can be reduced.

According to an 11th aspect of the present invention, in the error correction method of the 10th aspect, in the deinterleave mode changing step, a switching comparison value is calculated from the trigger signals, the calculated switching comparison value is compared with a deinterleave mode switching criterion, and when the switching comparison value satisfies the deinterleave mode switching criterion, the deinterleave mode is changed from a deinterleave mode initial value in accordance with a deinterleave mode switching order. Therefore, the lead-in time for the deinterleave mode judgement can be reduced, whereby the entire lead-in time of the demodulation system at the switching of deinterleave modes can be reduced.

According to a 12th aspect of the present invention, in the error correction method of the 10th or 11th aspect, in the deinterleave step, address counters for respective deinterleave modes are reset in accordance with the frame sync signal, the respective address counters count up simultaneously, one of outputs from the address counters is selected in accordance with the changed deinterleave mode, to generate a memory address, and the received data is deinterleaved on the basis of the memory address. Therefore, the lead-in time for the deinterleave mode judgement can be reduced, whereby the entire lead-in time of the demodulation system at the switching of deinterleave modes can be reduced.

According to a 13th aspect of the present invention, in the error correction method of the 12th aspect, in the deinterleave step, convolutional deinterleave is performed using the number of channels and a depth for each deinterleave mode. Therefore, the lead-in time at the convolutional deinterleave mode judgement can be reduced.

According to a 14th aspect of the present invention, in the error correction method of the 13th aspect, in the deinterleave step, the number-of-channel counter for generating an address corresponding to each deinterleave mode is reset upon receipt of the frame sync signal, then when the deinterleave mode is changed, one output of the number-of-channel counter is selected, a depth in the convolutional deinterleave is identified in accordance with the selected number of channels and the changed deinterleave mode, then the memory address is generated, and the received data is deinterleaved on the basis of the memory address. Therefore, the lead-in time for the convolutional deinterleave mode judgement can be reduced, whereby the entire lead-in time of the demodulation system at the switching of deinterleave modes can be reduced.

According to a 15th aspect of the present invention, in the error correction method of the 12th aspect, in the deinterleave step, block deinterleave is performed using the number of rows and the number of columns for each deinterleave mode. Therefore, the lead-in time at the block deinterleave judgement can be reduced.

According to a 16th aspect of the present invention, in the error correction method of the 15th aspect, in the deinterleave step, upon receipt of the frame sync signal, respective numbers of rows for all deinterleave modes are generated, a number of rows corresponding to the deinterleave mode that is changed in the deinterleave mode changing step is selected among the respective numbers of rows for all deinterleave modes, a number of columns in the block deinterleave is identified on the basis of the selected number of rows and the changed deinterleave mode, then the memory address is generated, and the block deinterleave is performed on the basis of the memory address. Therefore, the lead-in time for the block deinterleave mode judgement can be reduced, whereby the entire lead-in time of the demodulation system at the switching of deinterleave modes can be reduced.

According to a 17th aspect of the present invention, in the error correction method of the 10th aspect, in the deinterleave mode changing step, when a reset signal is inputted upon change of a frame head position, the deinterleave mode is changed. Therefore, the lead-in time for the deinterleave mode judgement can be reduced, whereby the entire lead-in time of the demodulation system at the reset can be reduced.

According to an 18th aspect of the present invention, the error correction method of the 10th aspect includes: a selection step of selecting either the deinterleave mode changed in the deinterleave mode changing step, or a deinterleave mode inputted from outside, in accordance with a select signal that is inputted from outside, and outputting the selected deinterleave mode. Therefore, the leading into the deinterleave mode is completed in the minimum lead-in time, whereby the lead-in time of the demodulation system at the switching of modes can be reduced.

BRIEF DESCRIPTION OF THE DRAWINGS

FIG. 5 is a diagram showing a list of deinterleave modes according to the first embodiment.

DETAILED DESCRIPTION OF THE PREFERRED EMBODIMENTS

[Embodiment 1]

Hereinafter, an error correction apparatus and an error correction method according to a first embodiment of the present invention will be described. Here, the error correction apparatus according to the first embodiment performs convolutional deinterleave and thereafter performs Reed-Solomon decoding, and a case where deinterleave modes as shown in FIG. 5 are inserted in data is shown.

Figure 1:
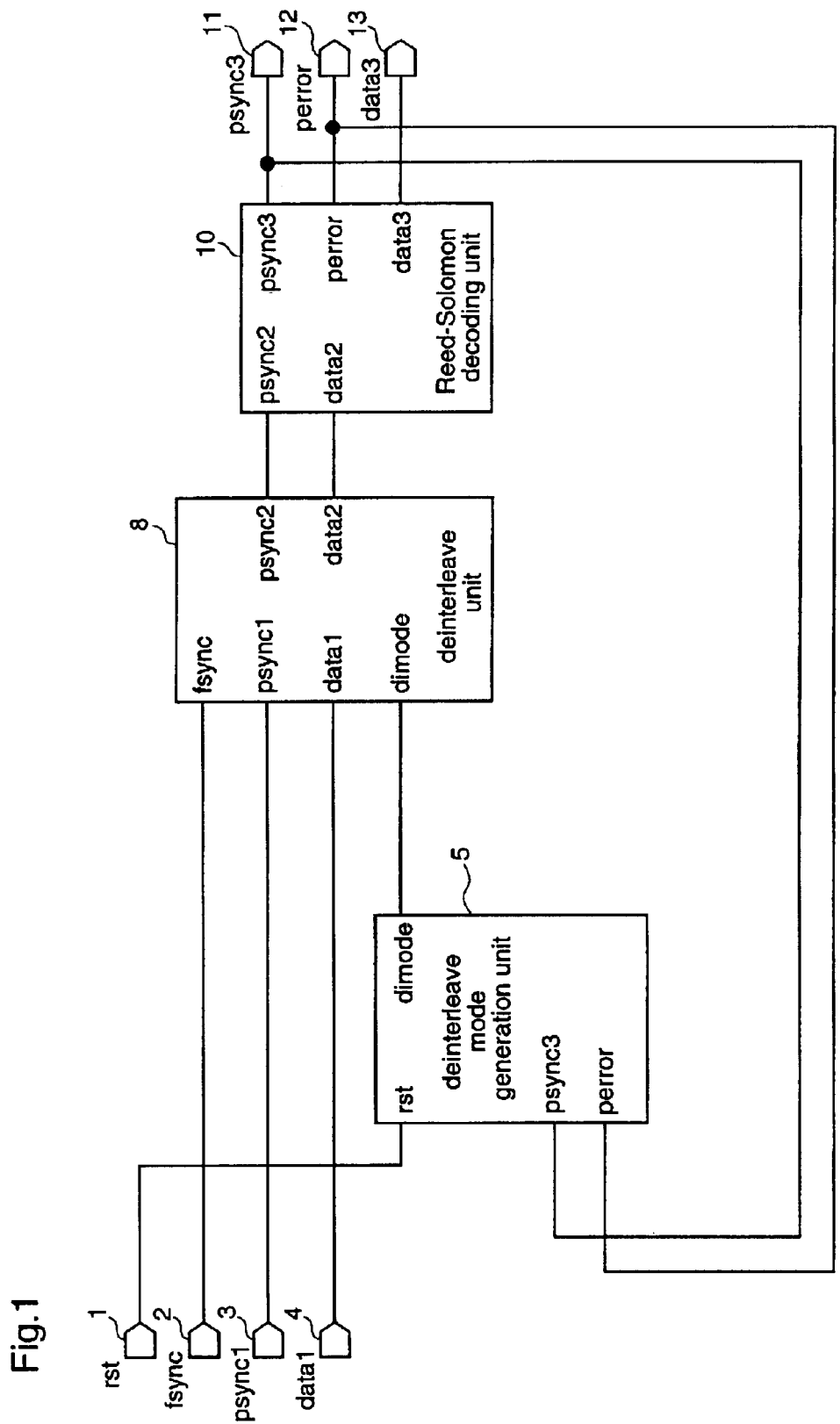
FIG. 1 is a block diagram illustrating a structure of an error correction apparatus according to a first embodiment.

FIG. 1 is a block diagram illustrating a structure of the error correction apparatus according to the first embodiment.

An input terminal 1 receives a reset signal (rst) when the head position of a frame that is synchronized with data (data1) is determined or changed. An input terminal 2 receives a frame sync signal (fsync) that is synchronized with the data (data1). An input terminal 3 receives a Reed-Solomon packet head signal (psync1) that is synchronized with the data (data1). An input terminal 4 receives the data (data1).

A deinterleave mode generation unit 5 generates a deinterleave mode (dimode). A deinterleave unit 8 subjects the inputted data (data1) to deinterleaving corresponding to the deinterleave mode (dimode) generated by the deinterleave mode generation unit 5. A Reed-Solomon decoding unit 10 subjects deinterleaved data (data2) to Reed-Solomon decoding.

An output terminal 11 outputs a Reed-Solomon packet head signal (psync3) that is synchronized with data (data3), to the outside. An output terminal 12 outputs a Reed-Solomon packet error signal (perror) that is synchronized with the data (data3), to the outside. An output terminal 13 outputs Reed-Solomon decoded data (data3) resulting from the error correction, to the outside.

Figure 2:
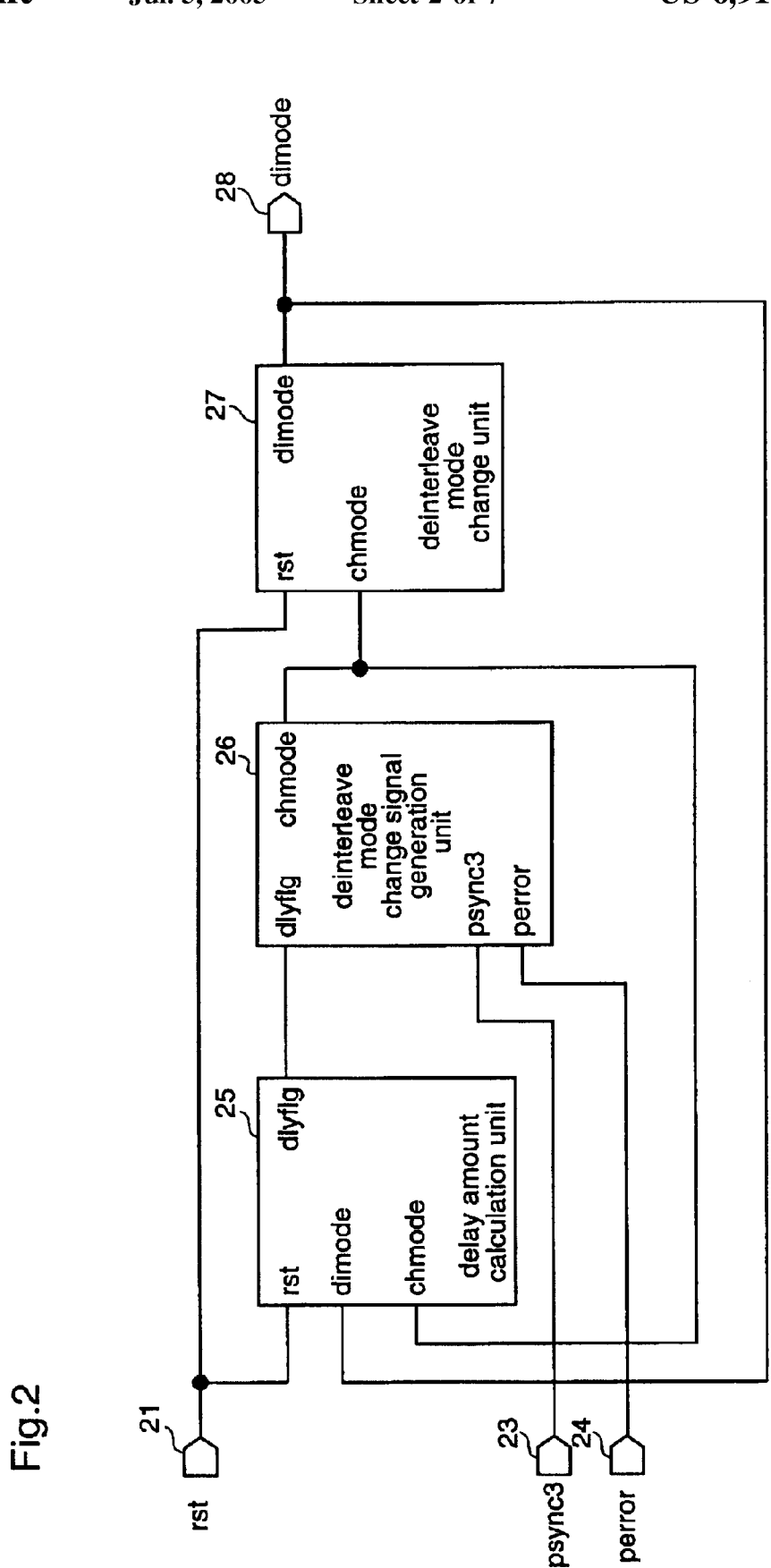
FIG. 2 is a block diagram illustrating a structure of a deinterleave mode generation unit according to the first embodiment.

FIG. 2 is a block diagram illustrating a structure of the deinterleave mode generation unit of the error correction apparatus according to the first embodiment.

An input terminal 21 receives the reset signal (rst). An input terminal 23 receives the Reed-Solomon packet head signal (psync3). An input terminal 24 receives the error signal (perror) of each Reed-Solomon packet.

A delay amount calculation unit 25 calculates an amount of delay corresponding to each deinterleave mode. A deinterleave mode change signal generation unit 26 generates a deinterleave mode change signal (chmode). A deinterleave mode change unit 27 changes a deinterleave mode signal (dimode).

An output terminal 28 outputs the change deinterleave mode to the deinterleave unit 8.

When the numbers of channels corresponding to respective modes are stored in a register, the convolutional deinterleave unit is capable of deinterleaving data from the register. Further, in this first embodiment, the numbers of channels are all powers of 2 (see FIG. 5). Thus, by using a 7-bit counter output for counting the maximum number of channels, 127, and outputs after high-order bits are masked when the high-order bits of the counter are not required, this apparatus can deinterleave data even when the deinterleave mode is changed in the middle of a frame.

Figure 4:
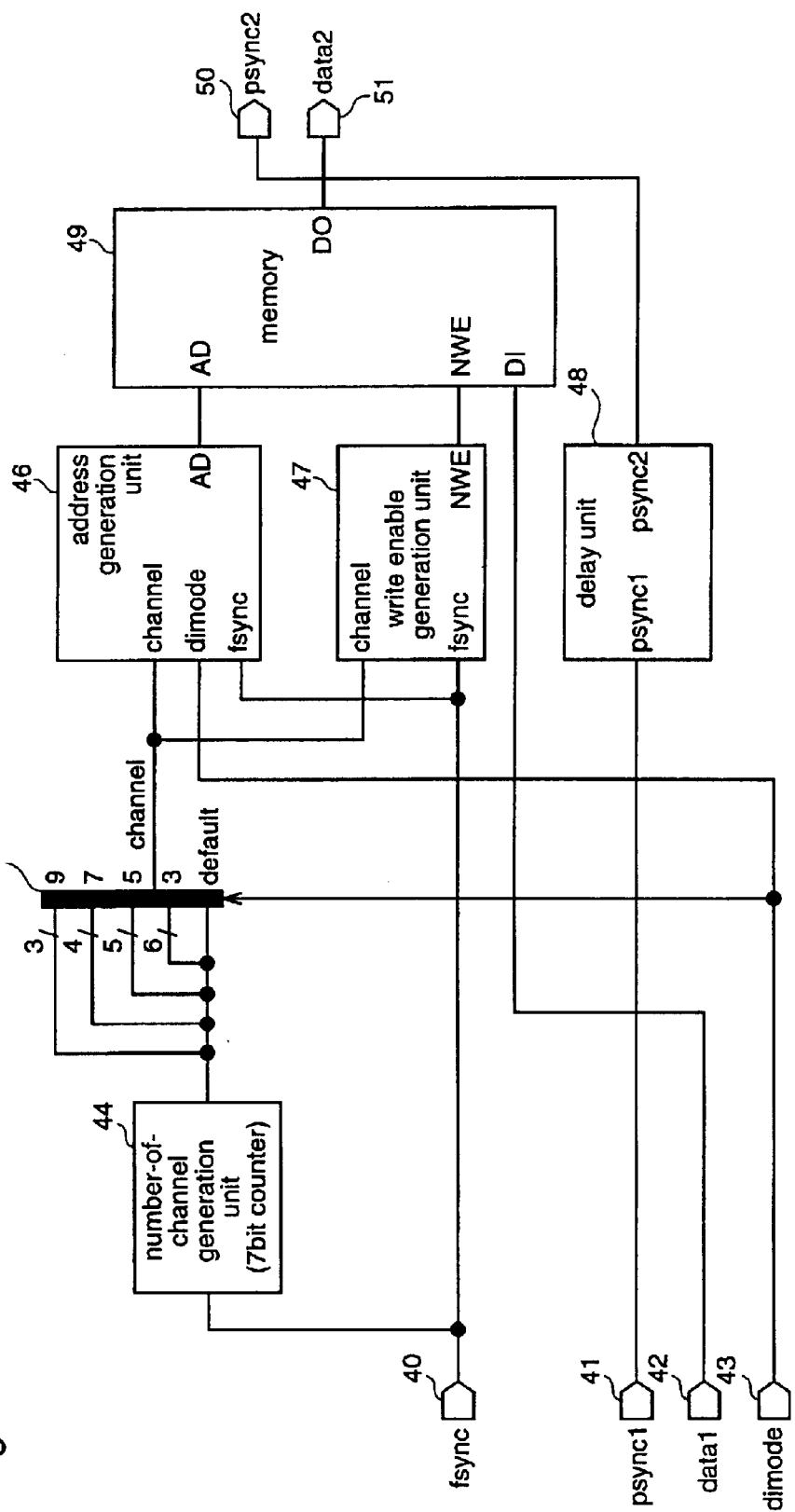
FIG. 4 is a block diagram illustrating a structure of a deinterleave unit according to the first embodiment.

Therefore, when the deinterleave unit 8 comprises, as shown in FIG. 4, a number-of-channel generation unit 44, a selector 45, an address generation unit 46, a write enable generation unit 47, a delay unit 48 and a memory (RAM) 49, one memory can be commonly used in plural modes. Consequently, plural deinterleave unit corresponding to respective modes are not required, thereby reducing the circuit scale.

An input terminal 40 receives the frame sync signal (fsync). An input terminal 41 receives the Reed-Solomon packet head signal (psync1). An input terminal 42 receives the inputted data (data1). An input terminal 43 receives the deinterleave mode (dimode).

The number-of-channel generation unit 44 generates the numbers of channels, and outputs all 7 bits, low-order 6 bits, low-order 5 bits, low-order 4 bits, and low-order 3 bits, corresponding to the numbers of channels, to the selector 45. The selector 45 selects one of the numbers of channels (channel) which are generated by the number-of-channel generation unit 44, i.e., default, the number of channels 3, the number of channels 5, the number of channels 7, and the number of channels 9, in accordance with the deinterleave mode (dimode) that is inputted through the input terminal 43. The address generation unit 46 generates a memory address (AD) for the deinterleaving. The write enable apparatus 47 generates a write enable signal (NWE). The delay unit 48 outputs a Reed-Solomon packet head signal (psync2) that is synchronized with data (data2), to an output terminal 50. The memory 49 outputs the deinterleaved data (data2) to an output terminal 51.

The output terminal 50 outputs the Reed-Solomon packet head signal (psync2) that is synchronized with the data (data2) to the Reed-Solomon decoding unit 10. The output terminal 51 outputs the deinterleaved data (data2) to the Reed-Solomon decoding unit 10.

The operation of the error correction apparatus that is configured as described above will be described.

The data (data1), the frame sync signal (fsync) that is synchronized with the data (data1), and the Reed-Solomon packet head signal (psync1) that is synchronized with the data (data1) are inputted to the deinterleave unit 8 through the input terminals 2 to 4.

Further, when the head position of the frame that is synchronized with the data (data1) is determined or changed, the reset signal (rst) is inputted to the deinterleave mode generation unit 5 through the input terminal 1. When the Reed-Solomon packet head signal (psync3) and the Reed-Solomon packet error signal (perror) which are outputted from the Reed-Solomon decoding unit 10, and the reset signal (rst) are inputted, the deinterleave mode generation unit 5 generates a deinterleave mode (dimode) and outputs the same to the deinterleave unit 8.

When the respective signals (fsync, psync1, data1) which are outputted through the input terminals 2, 3 and 4, and the deinterleave mode (dimode) that is outputted from the deinterleave mode generation unit 5 are inputted, the deinterleave unit 8 deinterleaves the data (data1), and outputs deinterleaved data (data2) and a Reed-Solomon packet head signal (psycn2) that is synchronized with the deinterleaved data (data2), to the Reed-Solomon decoding unit 10.

When the deinterleaved data (data2) and the Reed-Solomon packet head signal (psync2) that is synchronized with the deinterleaved data (data2) are inputted, the Reed-Solomon decoding unit 10 subjects the data (data2) to Reed-Solomon decoding, and outputs a Reed-Solomon decoded data (data3) resulting from the error correction to the output terminal 13, as well as outputs a Reed-Solomon packet head signal (psync3) that is synchronized with the decoded data (data3) to the output terminal 11 and the deinterleave mode generation unit 5, and further outputs a Reed-Solomon packet error signal (perror) that is synchronized with the data (data3) to the output terminal 12 and the deinterleave mode generation unit 5.

Next, the operation of the deinterleave mode generation unit 5 will be described in detail with reference to FIG. 2.

When the reset signal (rst) is inputted through the input terminal 21, or when the deinterleave mode change signal (chmode) that is outputted from the deinterleave mode change signal generation unit 26 is switched ON, the delay amount calculation unit 25 switches a delay amount calculation completion signal (dlyflag) OFF, resets a counter (not shown) at zero, and starts counting. Then, it counts up the delay amount that is processing time of the deinterleave unit 8 and the Reed-Solomon decoding unit 10, for each deinterleave mode (dimode) outputted from the deinterleave mode change unit 27. When the calculation of the delay amount is completed, the apparatus 25 switches the delay amount calculation completion signal (dlyflg) ON, and outputs the signal to the deinterleave mode change signal generation unit 26.

Assuming that the deinterleaving is changed on the condition that the Reed-Solomon packet head signal (psync3) that is inputted through the input terminal 23 and the Reed-Solomon packet error signal (perror) that is inputted through the input terminal 24 are switched ON, i.e., when at the head position of a segment the immediately preceding segment cannot be error-corrected according to the Reed-Solomon, the deinterleave mode change signal generation unit 26 switches the deinterleave mode change signal (chmode) ON when the delay amount calculation completion signal (dlyflg) that is outputted from the delay amount calculation unit 25, the Reed-Solomon packet head signal (psycn3), and the Reed-Solomon packet error signal (perror) are ON (otherwise, switches the signal OFF), and outputs the change signal to the delay amount calculation unit 25 and the deinterleave mode change unit 27.

Here, when the Reed-Solomon packet head signal (psync3) is ON, the signal indicates the head of the segment, and when the Reed-Solomon packet error signal (perror) is ON, the signal indicates that one segment was processed according to the Reed-Solomon, but could not be error-corrected.

When the reset signal (rst) is inputted through the input terminal 21, the deinterleave mode change unit 27 sets the deinterleave mode (dimode) at a predetermined initial value, then when the deinterleave mode change signal (chmode) is ON, changes the deinterleave mode (dimode) in a predetermined order, and outputs the changed deinterleave mode to the deinterleave unit 8.

Figure 3:
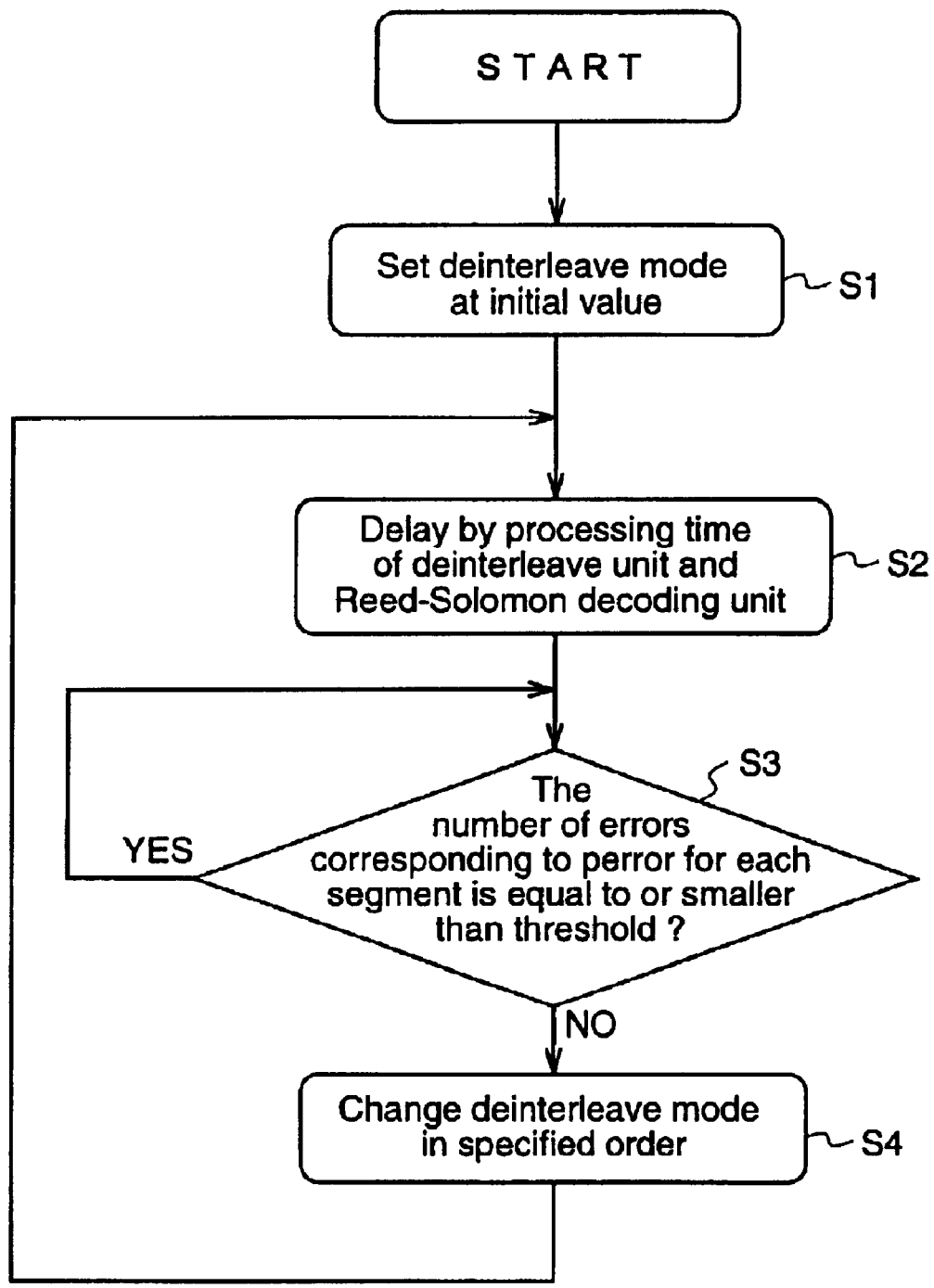
FIG. 3 is a flowchart for showing processes of the deinterleave mode generation unit according to the first embodiment.

Next, the operation of the deinterleave mode generation unit will be described in more detail with reference to FIG. 3.

Initially, upon receipt of the reset signal (rst), the deinterleave mode (dimode) is set at the predetermined initial value (S1), then the delay amount corresponding to the processing time of the deinterleave unit 8 and the Reed-Solomon decoding unit is counted up (S2), and the number of errors corresponding to the Reed-Solomon packet error signal (perror) is compared with a threshold, i.e., switching criterion (S3). Here, the threshold as the switching criterion may be set from the outside or may be decided by a register or the like.

When the number of errors corresponding to the Reed-Solomon packet error signal (perror) is larger than the threshold, the deinterleave mode is changed in the specified order, and the changed mode is outputted to the deinterleave unit 8 (S4).

Next, the operation of the deinterleave unit 8 will be described in more detail with reference to FIG. 4.

When the frame sync signal (fsync) that is inputted through the input terminal 40 is switched ON, the number-of-channel generation unit 44 resets the counter at zero, repeats counting-up from zero to 127, generates the numbers of channels (channel) for all deinterleave modes from the counter outputs, and outputs the numbers of channels to the selector 45.

The selector 45 selects one of the numbers of channels (channel) in accordance with the value of the deinterleave mode (dimode) that is inputted through the input terminal 43, and outputs the selected number to the address generation unit 46 and the write enable generation unit 47.

The address generation unit 46 identifies the depth in the convolutional deinterleave on the basis of the number of channels (channel) selected by the selector 45 and the deinterleave mode (dimode) that is inputted through the input terminal 43, generates a memory address (AD), and outputs the generated address to the memory 49.

The write enable generation unit 47 generates a write enable signal (NEW) on the basis of the number of channels (channel) selected by the selector 45 and the frame sync signal (fsync) that is inputted through the input terminal 40, and outputs the generated write enable signal to the memory 49.

The delay unit 48 calculates a delay amount of Reed-Solomon packet head signal (psync1) corresponding to each deinterleaving, in accordance with the deinterleave mode (dimode), and outputs a Reed-Solomon packet head signal (psync2) that is synchronized with output (data2) of the memory 49, to the output terminal 50.

The memory 49 deinterleaves inputted data (DI) on the basis of the memory address (AD) and the write enable signal (NEW), and outputs deinterleaved data (DO) to the output terminal 51.

In this first embodiment, the Reed-Solomon packet head signal and the Reed-Solomon packet error signal which are outputted from the Reed-Solomon decoding unit 10 are used as trigger signals for changing the deinterleave mode, and further, the deinterleave mode generation unit 5 is provided for changing the deinterleave mode on the basis of the trigger signals. Accordingly, the lead-in time for the deinterleave mode judgment is reduced, and consequently the lead-in time of the demodulation system at the reset or switching of modes can be reduced. Further, when the mode is changed, the time taken to display images on a television of the like is shorter than in the case of the prior art, thereby improving the responsibility at the power-on or switching of modes.

[Embodiment 2]

Hereinafter, an error correction apparatus and an error correction method according to a second embodiment of the present invention will be described.

Figure 6:
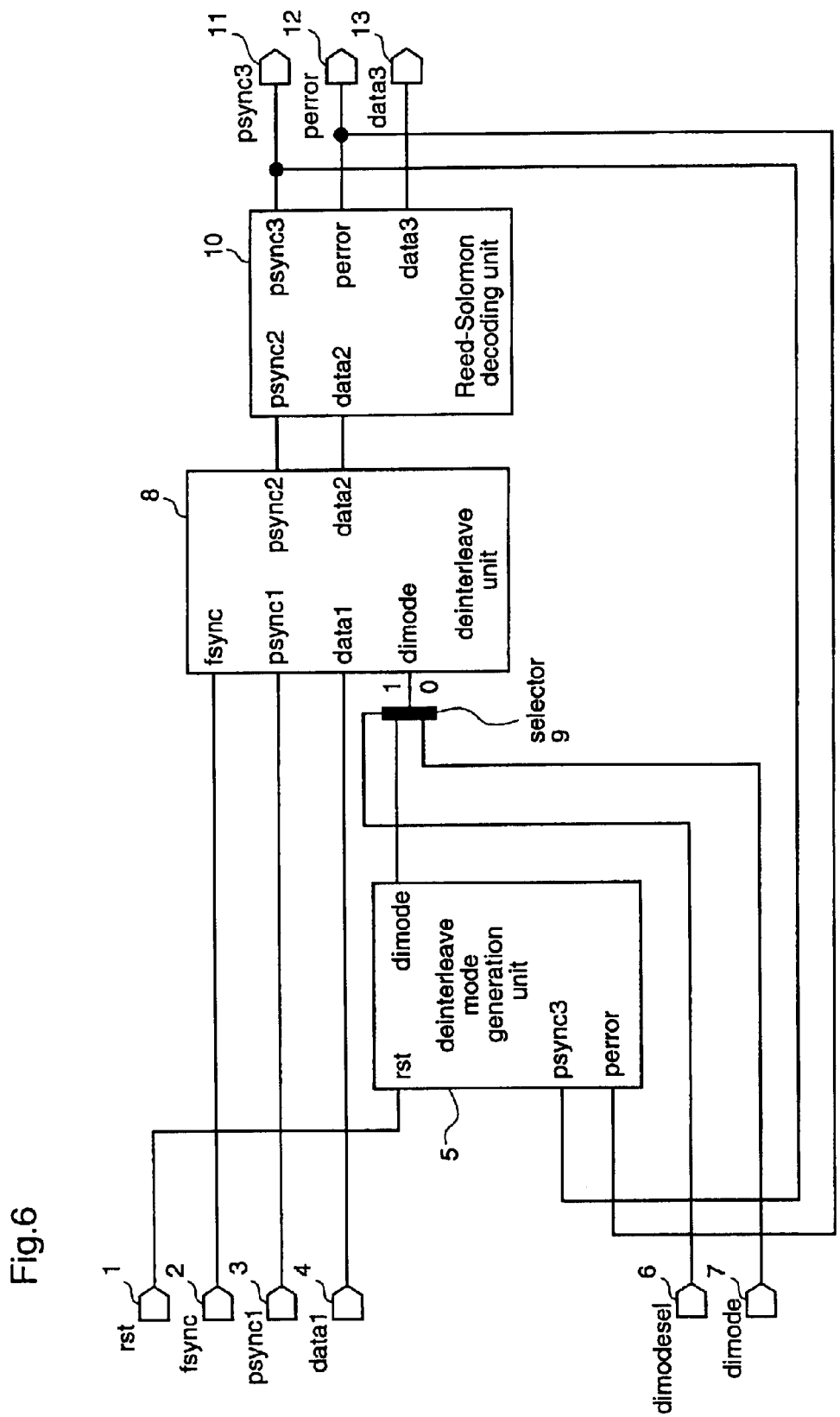
FIG. 6 is a block diagram illustrating a structure of an error correction apparatus according to a second embodiment.
Figure 7:
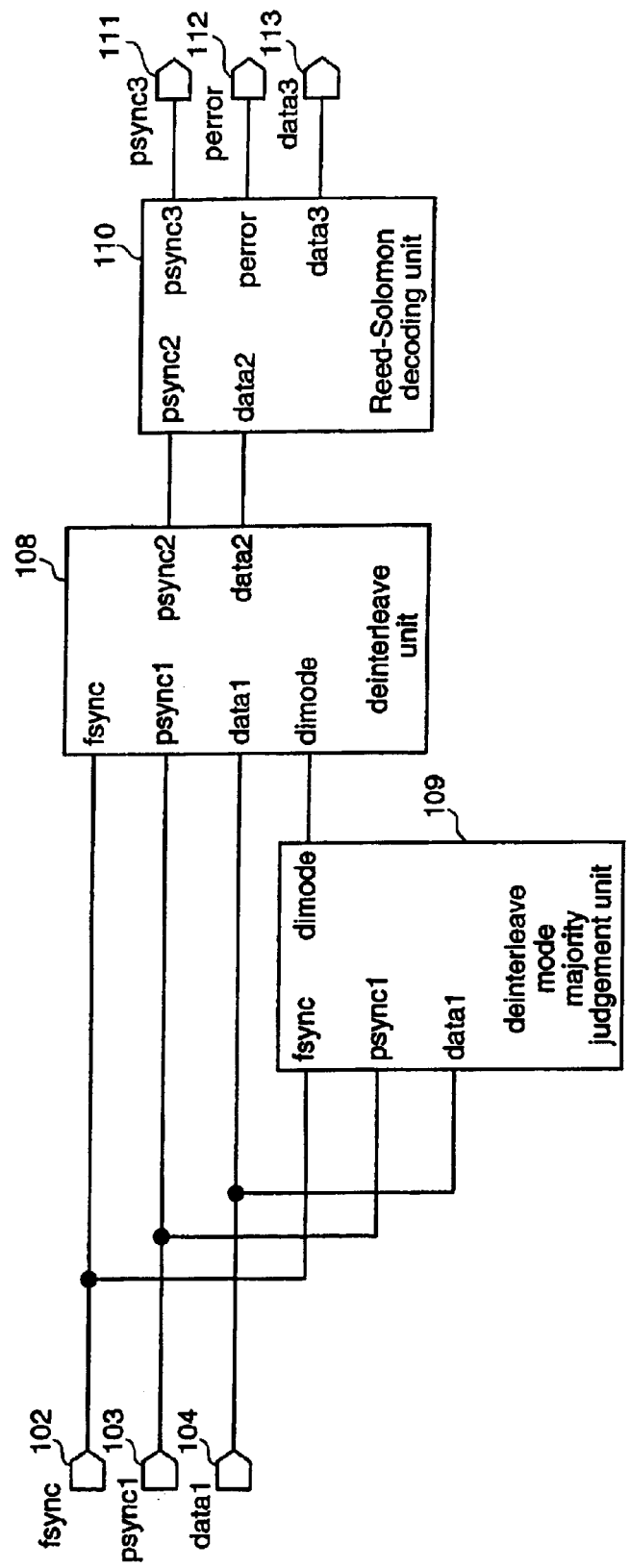
FIG. 7 is a block diagram illustrating a structure of a prior art error correction apparatus.

FIG. 6 is a block diagram illustrating a structure of an error correction apparatus according to the second embodiment. In FIG. 6, the same reference numerals as those in FIG. 1 denotes the same or corresponding components, and their descriptions are omitted here.

An input terminal 6 receives a select signal (dimodesel) for switching between a deinterleave mode that is inputted through an input terminal 7 and a deinterleave mode that is obtained by the deinterleave mode generation unit 5. The input terminal 7 receives a deinterleave mode (dimode) that is designated from the outside.

A selector 9 selects either the deinterleave mode (dimode) that is outputted from the deinterleave mode generation unit 5 or the deinterleave mode (dimode) that is inputted through the input terminal 7, in accordance with the select signal (dimodesel) that is inputted through the input terminal 6. A deinterleave unit 8 subjects the inputted data (data1) to deinterleaving corresponding to the deinterleave mode (dimode) that is selected by the selector 9.

The operation of the error correction apparatus that is configured as described above will be described.

The data (data1), the frame sync signal (fsync) that is synchronized with the data (data1), and the Reed-Solomon packet head signal (psync1) that is synchronized with the data (data1) are inputted to the deinterleave unit 8 through the input terminals 2 to 4.

When the head position of a frame that is synchronized with the data (data1) is determined or changed, the reset signal (rst) is inputted to the deinterleave mode generation unit 5 through the input terminal 1. When a Reed-Solomon packet head signal (psync3) and a Reed-Solomon packet error signal (perror) that are outputted from the Reed-Solomon decoding unit 10, and the reset signal (rst) are inputted, the deinterleave mode generation unit 5 generates a deinterleave mode (dimode) and outputs the same to the selector 9.

The selector 9 switches between the deinterleave mode (dimode) that is outputted from the deinterleave mode generation unit 5 and the deinterleave mode (dimode) that is designated from the outside through the input terminal 7, in accordance with the select signal (dimodesel) that is inputted through the input terminal 6, and outputs the selected deinterleave mode (dimode) to the deinterleave unit 8.

When the respective signals (fsync, psync1, data1) that are inputted through the input terminals 2, 3 and 4, and the deinterleave mode (dimode) that is selected by the selector 9 are inputted, the deinterleave unit 8 deinterleaves the data (data1), and outputs deinterleaved data (data2) and a Reed-Solomon packet head signal (psync2) that is synchronized with the data (data2) to the Reed-Solomon decoding unit 10.

When the deinterleaved data (data2) and the Reed-Solomon packet head signal (psync2) that is synchronized with the data (data2) are inputted, the Reed-Solomon decoding unit 10 subjects the data (data2) to Reed-Solomon decoding and outputs Reed-Solomon decoded data (data3) resulting from the error correction, to the output terminal 13, as well as outputs a Reed-Solomon packet head signal (psync3) that is synchronized with the data (data3) to the output terminal 11 and the deinterleave mode generation unit 5, and further outputs a Reed-Solomon packet error signal (perror) that is synchronized with the data (data3) to the output terminal 12 and the deinterleave mode generation unit 5.

In this second embodiment, either of the deinterleave mode that is generated by the deinterleave mode generation unit 5 or the deinterleave mode inputted from outside is selected in accordance with the select signal from outside, whereby the leading into the selected deinterleave mode is completed in the minimum lead-in time, and the lead-in time of the demodulation system at the reset or switching of modes can be reduced. Consequently, when the mode is changed, the time taken to display images on a television or the like is shorter than that in the prior art, thereby increasing the responsibility at the power-on or the switching of modes.

In the first and second embodiments, the descriptions have been given of the case where the deinterleave unit performs the convolutional deinterleave, using the information concerning the number of channels and the depth corresponding to each deinterleave mode. When this apparatus performs block deinterleave, using information concerning the number of rows and the number of columns corresponding to each deinterleave mode, the deinterleave unit generates the respective numbers of rows for all deinterleave modes upon receipt of the frame sync signal, then selects the number of rows corresponding to a deinterleave mode generated by the deinterleave mode generation unit, among the numbers of rows for all deinterleave modes, identifies the number of columns in the block deinterleave on the basis of the selected number of rows and the deinterleave mode, and then generates a memory address. Accordingly, the same effects as those in the case of convolutional deinterleave are obtained.

What is claimed is:

1. An error correction apparatus that performs error correction of received data according to a deinterleave mode inserted in the received data, comprising:

a deinterleave unit for receiving a frame sync signal and a first Reed-Solomon packet head signal which are synchronized with received data, deinterleaving the received data, and outputting deinterleaved data and a second Reed-Solomon packet head signal that is synchronized with the deinterleaved data;

a Reed-Solomon decoding unit for receiving the second Reed-Solomon packet head signal that is synchronized with the deinterleaved data, Reed-Solomon decoding the deinterleaved data, and outputting Reed-Solomon decoded data resulting from error correction as well as outputting a third Reed-Solomon packet head signal and a Reed-Solomon packet error signal which are synchronized with the Reed-Solomon decoded data; and a deinterleave mode generation unit for receiving the third Reed-Solomon packet head signal and the Reed-Solomon packet error signal as trigger signals for changing the deinterleave mode, and generating a changed deinterleave mode.

2. The error correction apparatus of claim 1, wherein the deinterleave mode generation unit comprises:

a calculation means for calculating a switching comparison value from trigger signals;

a comparison means for comparing the switching comparison value with a predetermined deinterleave mode switching criterion; and a changing means for, when the switching comparison value satisfies the deinterleave mode switching criterion, changing the deinterleave mode from a deinterleave mode initial value in accordance with a deinterleave mode switching order, and outputting a changed deinterleave mode.

3. The error correction apparatus of claim 1, wherein the deinterleave unit comprises:

an address generation unit for receiving a frame sync signal, generating memory addresses corresponding to respective deinterleave modes, selecting among the generated memory addresses a memory address corresponding to the deinterleave mode generated by the deinterleave mode generation unit, and outputting the selected memory address; and a memory for deinterleaving the received data in accordance with the selected memory address and outputting deinterleaved data.

4. The error correction apparatus of claim 1, wherein the deinterleave mode generation unit is for generating the deinterleave mode when a reset signal is inputted upon change of a frame head position.

5. The error correction apparatus of claim 1, wherein a selector for selecting either the deinterleave mode outputted from the deinterleave mode generation apparatus, or a deinterleave mode inputted from outside, in accordance with a select signal that is inputted from outside, and outputting the selected deinterleave mode, said selector connected between the deinterleave mode generation unit and the deinterleave unit.

6. An error correction apparatus that performs error correction of received data according to a deinterleave mode inserted in the received data, comprising:

a deinterleave unit for receiving a frame sync signal and a first Reed-Solomon packet head signal which are synchronized with received data, deinterleaving the received data, and outputting deinterleaved data and a second Reed-Solomon packet head signal that is synchronized with the deinterleaved data;

a Reed-Solomon decoding unit for receiving the second Reed-Solomon packet head signal that is synchronized with the deinterleaved data, Reed-Solomon decoding the deinterleaved data, and outputting Reed-Solomon decoded data resulting from error correction as well as outputting a third Reed-Solomon packet head signal and a Reed-Solomon packet error signal which are synchronized with the Reed-Solomon decoded data; and a deinterleave mode generation unit for receiving the third Reed-Solomon packet head signal and the Reed-Solomon packet error signal as trigger signals for changing the deinterleave mode, and generating a changed deinterleave mode, wherein:

the deinterleave unit comprises:

an address generation unit for receiving a frame sync signal, generating memory addresses corresponding to respective deinterleave modes, selecting among the generated memory addresses a memory address corresponding to the deinterleave mode generated by the deinterleave mode generation unit, and outputting the selected memory address; and a memory for deinterleaving received data in accordance with the selected memory address and outputting deinterleaved data; and the deinterleave unit is for performing convolutional deinterleave using information concerning a number of channels and a depth for each deinterleave mode.

7. The error correction apparatus of claim 6, wherein the deinterleave unit comprises:

a number-of-channel counter for outputting respective numbers of channels for all deinterleave modes upon receipt of the frame sync signal; and a selector for receiving the deinterleave mode generated by the deinterleave mode generation unit, selecting one output of the number-of-channel counter in accordance with the generated deinterleave mode, and outputting the selected output to the address generation unit, wherein the address generation unit is for identifying a depth for the convolutional deinterleave on the basis of the deinterleave mode generated by the deinterleave mode generation unit and the number of channels, and for generating a memory address.

8. An error correction apparatus that performs error correction of received data according to a deinterleave mode inserted in the received data, comprising:

a deinterleave unit for receiving a frame sync signal and a first Reed-Solomon packet head signal which are synchronized with received data, deinterleaving the received data and outputting deinterleaved data and a second Reed-Solomon packet head signal that is synchronized with the deinterleaved data;

a Reed-Solomon decoding unit for receiving the second Reed-Solomon packet head signal that is synchronized with the deinterleaved data, Reed-Solomon decoding the deinterleaved data, and outputting Reed-Solomon decoded data resulting from error correction as well as outputting a third Reed-Solomon packet head signal and a Reed-Solomon packet error signal which are synchronized with the Reed-Solomon decoded data; and a deinterleave mode generation unit for receiving the third Reed-Solomon packet head signal and the Reed-Solomon packet error signal as trigger signals for changing the deinterleave mode, and generating a changed deinterleave mode, wherein the deinterleave unit comprises:

an address generation unit for receiving a frame sync signal, generating memory addresses corresponding to respective deinterleave modes, selecting among the generated memory addresses a memory address corresponding to the deinterleave mode generated by the deinterleave mode generation unit, and outputting the selected memory address; and a memory for deinterleaving received data in accordance with the selected memory address and outputting deinterleaved data; and the deinterleave unit is for performing block deinterleave using information concerning the number of rows and the number of columns for each deinterleave mode.

9. The error correction apparatus of claim 8, wherein the deinterleave unit is for generating respective numbers of rows for all deinterleave modes upon receipt of the frame sync signal, then selecting, among generated numbers of rows for all deinterleave modes, a number of rows corresponding to the deinterleave mode generated by the deinterleave mode generation unit, identifying a number of columns in the block deinterleave on the basis of the selected number of rows and the generated deinterleave modes, and generating a memory address.

10. An error correction method for performing error correction of received data according to a deinterleave mode inserted in the received data, comprising:

receiving the deinterleave mode, and a frame sync signal and a first Reed-Solomon packet head signal which are synchronized with the received data;

receiving deinterleaved data and a second Reed-Solomon packet head signal that is synchronized with the deinterleaved data, and Reed-Solomon decoding the deinterleaved data; and changing the deinterleave mode using a third Reed-Solomon packet head signal and a Reed-Solomon packet error signal which are synchronized with the Reed-Solomon decoded data as trigger signals.

11. The error correction method of claim 10, wherein changing the deinterleave mode comprises:

calculating a switching comparison value from the trigger signals, comparing the calculated switching comparison value with a deinterleave mode switching criterion, and when the switching comparison value satisfies the deinterleave mode switching criterion, changing the deinterleave mode from a deinterleave mode initial value in accordance with a deinterleave mode switching order.

12. The error correction method of claim 10, wherein receiving the deinterleave mode comprises:

resetting address counters for respective deinterleave modes in accordance with the frame sync signal, wherein respective address counters count up simultaneously, selecting one of outputs from the address counters in accordance with the changed deinterleave mode, to generate a memory address, and deinterleaving the received data on the basis of the memory address.

13. The error correction method of claim 12, wherein changing the deinterleave mode comprises performing block deinterleave using a number of rows and a number of columns for each deinterleave mode.

14. The error correction method of claim 13, wherein changing the deinterleave mode comprises:

upon receipt of the frame sync signal, generating respective numbers of rows for all deinterleave modes, selecting a number of rows corresponding to the deinterleave mode that is changed in changing the deinterleave mode among the respective numbers of rows for all deinterleave modes, identifying a number of columns in the block deinterleave on the basis of the selected number of rows and the changed deinterleave mode, then generating the memory address, and performing the block deinterleave on the basis of the memory address.

15. The error correction method of claim 10, wherein changing the deinterleave mode comprises changing the deinterleave mode when a reset signal is inputted upon change of a frame head position.

16. The error correction method of claim 10, comprises:

selecting either the deinterleave mode changed in changing the deinterleave mode, or a deinterleave mode inputted from outside, in accordance with a select signal that is inputted from outside, and outputting the selected deinterleave mode.

17. An error correction method for performing error correction of received data according to a deinterleave mode inserted in the received data, comprising:

receiving the deinterleave mode, and a frame sync signal and a first Reed-Solomon packet head signal which are synchronized with the received data;

receiving deinterleaved data and a second Reed-Solomon packet head signal that is synchronized with the deinterleaved data, and Reed-Solomon decoding the deinterleaved data; and changing the deinterleave mode using a Reed-Solomon packet head signal and a third Reed-Solomon packet error signal which are synchronized with the Reed-Solomon decoded data as trigger signals, wherein:

receiving the deinterleave mode comprises:

resetting address counters for respective deinterleave modes in accordance with the frame sync signal, wherein respective address counters count up simultaneously, selecting one of outputs from the address counters in accordance with the changed deinterleave mode, to generate a memory address, and deinterleaving the received data on the basis of the memory address; and changing the deinterleave mode comprises performing convolutional deinterleave using a number-of-channel counter for determining a number of channels and a depth for each deinterleave mode.

18. The error correction method of claim 17, wherein changing the deinterleave mode comprises:

resetting the number-of-channel counter for generating an address corresponding to each deinterleave mode upon receipt of the frame sync signal, then when the deinterleave mode is changed, selecting one output of the number-of-channel counter, identifying a depth in the convolutional deinterleave in accordance with the selected number of channels and the changed deinterleave mode, then generating the memory address, and deinterleaving the received data on the basis of the memory address.

* * * * *